United States Patent
Chiang et al.

(10) Patent No.: US 7,693,701 B2
(45) Date of Patent: *Apr. 6, 2010

(54) STRUCTURE FOR A CONFIGURABLE LOW POWER HIGH FAN-IN MULTIPLEXER

(75) Inventors: Owen Chiang, Austin, TX (US); Christopher M. Durham, Round Rock, TX (US); Peter J. Klim, Austin, TX (US); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/132,501

(22) Filed: Jun. 3, 2008

(65) Prior Publication Data

US 2008/0303554 A1 Dec. 11, 2008

Related U.S. Application Data

(63) Continuation-in-part of application No. 11/759,426, filed on Jun. 7, 2007, now Pat. No. 7,466,164.

(51) Int. Cl.
*G06F 17/50* (2006.01)
*H03K 19/094* (2006.01)

(52) U.S. Cl. ............... 703/14; 703/13; 703/15; 716/4; 716/12; 326/113; 326/104; 326/105

(58) Field of Classification Search ................. 326/113, 326/104–105; 716/2, 12; 703/13–15, 21
See application file for complete search history.

(56) References Cited

U.S. PATENT DOCUMENTS

| 6,496,956 B2 * | 12/2002 | Sako | 716/3 |
| 7,171,636 B2 * | 1/2007 | Sako | 716/3 |

* cited by examiner

*Primary Examiner*—Vibol Tan
(74) *Attorney, Agent, or Firm*—Dillon & Yudell LLP

(57) ABSTRACT

A configurable, low power high fan-in multiplexer (MUX) and design structure thereof are disclosed. The MUX circuit includes multiple current control elements, which each include multiple inverters coupled to a transmission gate. Each current control element receives a data signal and a select signal that corresponds to the data signal. If a select signal exceeds a threshold value (e.g., a logical "1"), the select signal deactivates a pull-up transistor (e.g., a p-type field effect transistor), and the transmission gate enables the corresponding data signal to provide input to a logic gate (e.g., a NAND gate) coupled to the output of the MUX. If the select signal does not exceed the threshold value, the select signal activates the pull-up transistor, and the transmission gate prevents the corresponding data signal from providing input to the logic gate.

15 Claims, 4 Drawing Sheets

US 7,693,701 B2

STRUCTURE FOR A CONFIGURABLE LOW POWER HIGH FAN-IN MULTIPLEXER

PRIORITY CLAIM

The present application is a continuation-in-part of U.S. patent application Ser. No. 11/759,426, titled "Method and Apparatus for a Configurable Low Power High Fan-In Multiplexer," filed on Jun. 7, 2007. Benefit of priority is hereby claimed under 35 U.S.C. §120 to U.S. patent application Ser. No. 11/759,426, which is incorporated by reference herein in its entirety and for all purposes.

BACKGROUND OF THE INVENTION

1. Technical Field

The present invention relates in general to a design structure for electrical circuits and in particular to a design structure for multiplexer (MUX) circuits. Still more particularly, the present invention relates to a design structure for a configurable, low power high fan-in MUX.

2. Description of the Related Art

Multiplexer (MUX) circuits select a single output signal from multiple input signals based on one or more control signals (e.g., a decoder signal). MUX circuits thus select a single data output from multiple individual data input streams over a period of time. MUX circuits are often utilized to perform critical functions in the forwarding logic and bypassing logic of electronic circuits.

MUX circuits typically include multiple logic gates, such as NAND gates, NOR gates, and logical inverters. However, conventional MUX circuits that include static NAND and/or NOR gates include numerous interconnections and are therefore very slow and large. Conventional MUX circuits also consume large amounts of power due to the large number of connections and logic gates within the MUX circuit. Furthermore, the designs of MUX circuits that include static NAND and/or NOR gates are difficult to re-configure for different applications (i.e., they are not flexible or configurable).

SUMMARY OF AN EMBODIMENT

Disclosed is a design structure for a configurable, low power high fan-in multiplexer (MUX). The MUX circuit includes multiple current control elements, which each include multiple inverters coupled to a transmission gate. Each current control element receives a data signal and a select signal that corresponds to the data signal. If a select signal exceeds a threshold value (e.g., a logical "1"), the select signal deactivates a pull-up transistor (e.g., a PFET), and the transmission gate enables the corresponding data signal to provide input to a logic gate (e.g., a NAND gate) coupled to the output of the MUX. If the select signal does not exceed the threshold value, the select signal activates the pull-up transistor, and the transmission gate prevents the corresponding data signal from providing input to the logic gate.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a design structure for a configurable, low power high fan-in multiplexer (MUX).

Figure 1:
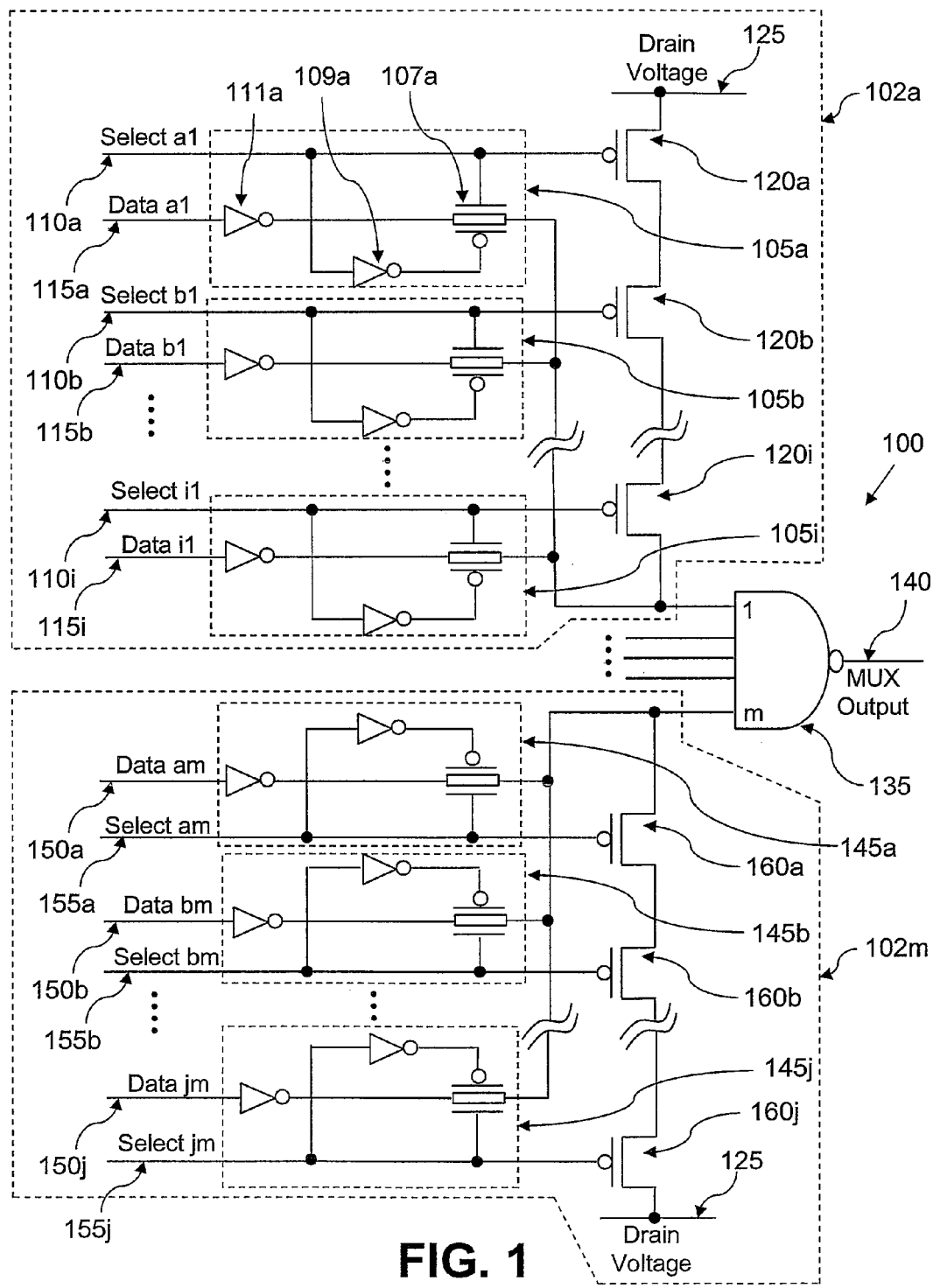
FIG. 1 is a schematic diagram of a configurable, low power high fan-in multiplexer (MUX), according to an embodiment of the present invention.

With reference now to FIG. 1, there is depicted a schematic diagram of a configurable, low power high fan-in MUX, according to an embodiment of the present invention. As shown, MUX 100 includes multiple fan-in elements 102a through 102m. MUX 100 also includes multiple current control elements 105a through 105i and 145a through 145j. A first (data) output of each current control element 105a-i and 145a-j is coupled to NAND gate 135. A second (select) output of each current control element 105a-i and 145a-j is coupled to a pull-up device, such as p-type field effect transistors (PFETs) 120a through 120i and 160a through 160j. The drain terminal of PFET 120a is coupled to drain voltage 125, and the source terminal of PFET 120a is coupled to the drain terminal of PFET 120b, such that PFETs 120a through 120i form a PFET chain (120a through 120i) that terminates at the source terminal of PFET 120i. The source terminal of PFET 120i is coupled to the same input of NAND gate 135 that is coupled to the data output of each current control element 105a-i. The PFET chain (120a-120i) enables NAND gate 135 to selectively function as an inverter by pulling up (i.e. setting to a logical "1") a terminal of NAND gate 135 when a select signal and a corresponding data signal are not active on the terminal.

Figure 3:
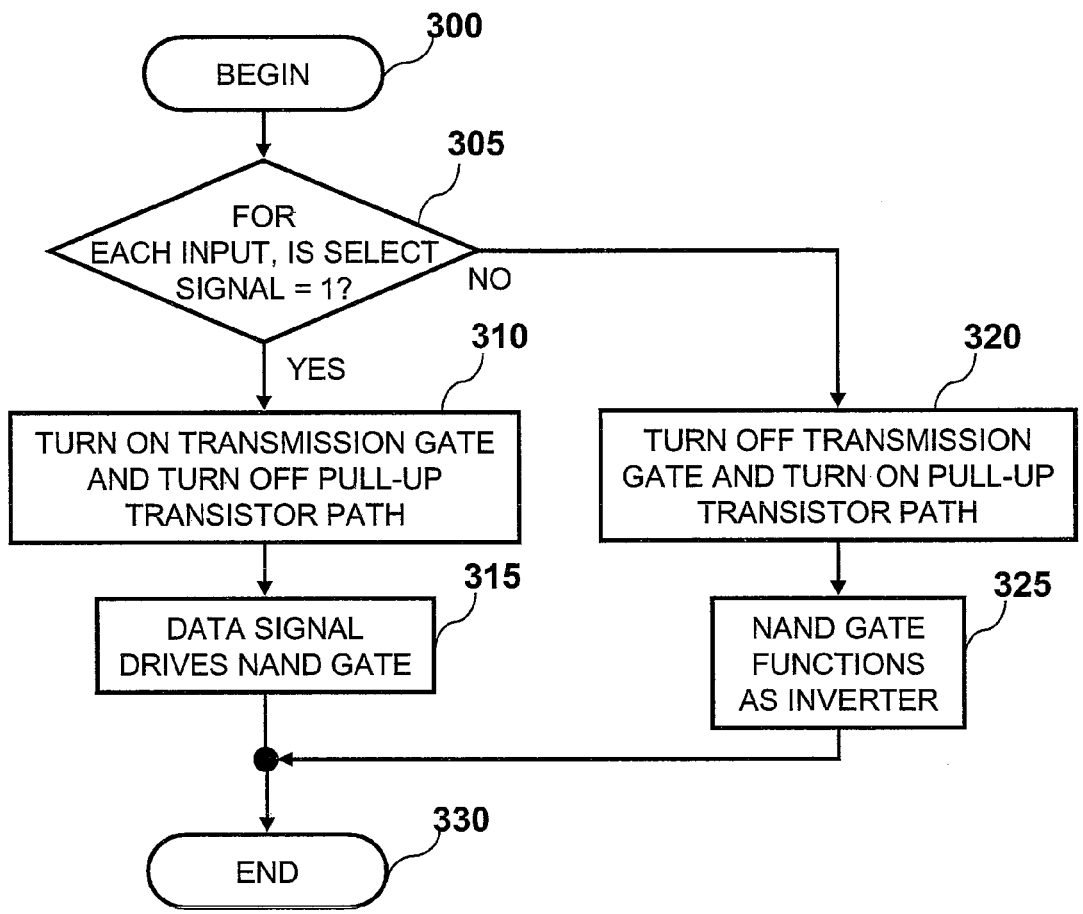
FIG. 3 is a high level logical flowchart of an exemplary method of implementing the configurable, low power high fan-in MUX of FIG. 1, according to an embodiment of the invention.

The output of NAND gate 135 provides MUX output signal 140. MUX 100 receives input from multiple select signals and data signals. A different select signal and a corresponding data signal are coupled to the inputs of each current control element 105a-i and 145a-j. For example, select a1 signal 110a is coupled to first inverter 109a, a first control terminal of transmission gate 107a, and the gate of PFET 120a. Data a1 signal 115a is coupled to second inverter 111a, which is coupled to an input of transmission gate 107a. The output of transmission gate 107a is in turn coupled to an input of NAND gate 135 that is also coupled to the source terminal of PFET 120i. The output of inverter 109a is coupled to a second control terminal of transmission gate 107a, thereby enabling select a1 signal 110a to selectively enable data a1 signal 115a to drive NAND gate 135, as illustrated in FIG. 3, which is discussed below. Similarly, select b1 signal 110b and data b1 signal 115b are coupled to current control element 105b, which enables select b1 signal 110b to selectively enable data b1 signal 115b to drive NAND gate 135.

According to the illustrative embodiment, MUX circuit 100 receives input from m data channels, where m is an integer. NAND gate 135 is thus coupled to m fan-in elements 102a-m that include multiple current control elements, including but not limited to current control elements 105a through 105i and current control elements 145a through 145j.

Current control elements 145a through 145j are configured similarly to current control elements 105a through 105i. For example, data jm signal 150j and select jm signal 155j are coupled to current control element 145j. Select jm signal 155j is coupled to the gate of PFET 160j. The drain terminal of PFET 160j is coupled to drain voltage 125, and the source terminal of PFET 160j is in turn coupled to the drain terminal of another PFET (not shown), thereby creating a pull-up PFET chain (160a through 160j) that terminates at the source terminal of PFET 160a. The source terminal of PFET 160a is coupled to the same input of NAND gate 135 that is coupled to the data output of each current control element 145a-i.

In one embodiment, NAND gate 135 has 3 input terminals (i.e., m=3). An 8-way MUX can thus be constructed with the first and second inputs of NAND gate 135 driven by fan-in elements 102a and 102b (not shown) that each include 3 transmission gates (i.e., 6 out of the 8 total inputs) and the third input of NAND gate 135 driven by a third fan-in element 102m that includes a single 2-way transmission gate (i.e., 2 out of the 8 total inputs). In another embodiment, an 8-way MUX could instead be constructed using a 2-way NAND gate (i.e., m=2), with both NAND gate inputs driven by fan-in elements 102a and 102m that each include 4 transmission gates (i.e., each fan-in element provides 4 out of the 8 total inputs). The present invention thus provides multiple means to construct an m-way MUX and is thus highly flexible and configurable. Furthermore, the present invention utilizes a single low power NAND gate (or a single low power NOR gate as illustrated in FIG. 2, which is discussed below) and thus occupies a small amount of physical space.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIG. 1 and 2xx for FIG. 2). The specific numerals assigned to the elements are provided solely to aid in the description and not meant to imply any limitations (structural or functional) on the invention.

Figure 2:
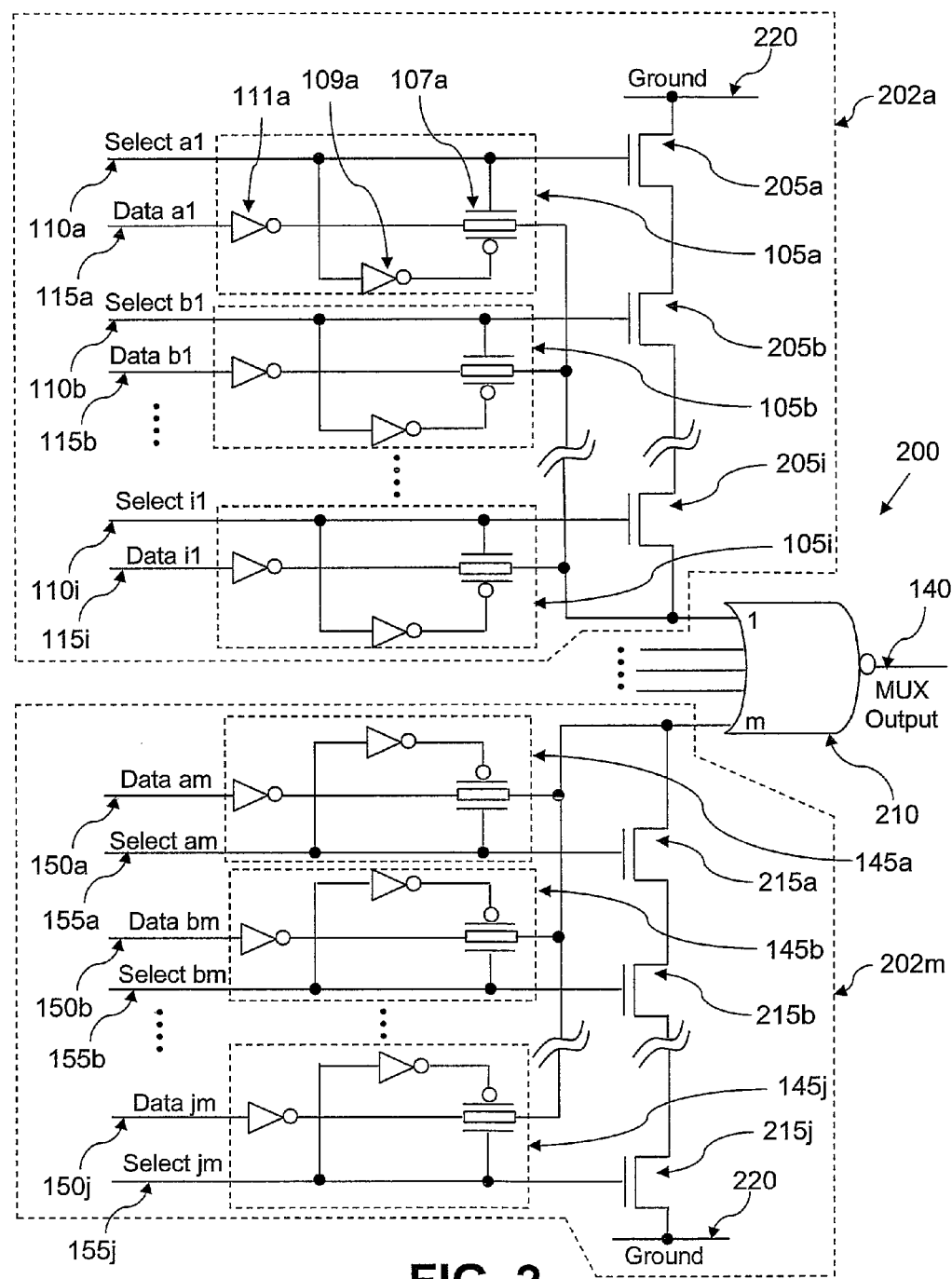
FIG. 2 is a schematic diagram of a configurable, low power high fan-in MUX, according to an alternate embodiment of the present invention.

With reference now to FIG. 2, there is depicted a schematic diagram of a configurable, low power high fan-in MUX, according to an alternate embodiment of the present invention. As shown, MUX 100 includes multiple fan-in elements 102a through 102m. MUX 200 also includes multiple current control elements 105a through 105i and 145a through 145j. A first (data) output of each current control element 105a-i and 145a-j is coupled to NOR gate 210. A second (select) output of each current control element 105a-i and 145a-j is coupled to a pull-up device, such as n-type field effect transistors (NFETs) 205a through 205i and 215a through 215j. The drain terminal of NFET 205a is coupled to ground voltage 220, and the source terminal of NFET 205a is coupled to the drain terminal of NFET 205b, such that NFETs 205a through 205i form a NFET chain (205a through 205i) that terminates at the source terminal of NFET 205i. The drain terminal of NFET 205i is coupled to the same input of NOR gate 210 that is coupled to the data output of each current control element 105a-i. The NFET chain (205a-205i) enables NOR gate 210 to selectively function as an inverter by pulling down (i.e. setting to a logical "0") a terminal of NOR gate 210 when a select signal and a corresponding data signal are not active on the terminal.

The output of NOR gate 210 provides MUX output signal 140. MUX 200 receives input from multiple select signals and data signals. A different select signal and a corresponding data signal are coupled to the inputs of each current control element 105a-i and 145a-j. For example, select a1 signal 110a is coupled to first inverter 109a, a first control terminal of transmission gate 107a, and the gate of NFET 205a. Data a1 signal 115a is coupled to second inverter 111a, which is coupled to an input of transmission gate 107a. The output of transmission gate 107a is in turn coupled to an input of NOR gate 210 that is also coupled to the drain terminal of NFET 205i. The output of inverter 109a is coupled to a second control terminal of transmission gate 107a, thereby enabling select a1 signal 110a to selectively enable data a1 signal 115a to drive NOR gate 210. Similarly, select b1 signal 110b and data b1 signal 115b are coupled to current control element 105b, which enables select b1 signal 110b to selectively enable data b1 signal 115b to drive NOR gate 210.

According to the illustrative embodiment, MUX circuit 200 receives input from m data channels, where m is an integer. NOR gate 210 is thus coupled to m fan-in elements 102a-m that include multiple current control elements, including but not limited to current control elements 105a through 105i and current control elements 145a through 145j. Current control elements 145a through 145j are configured similarly to current control elements 105a through 105i. For example, data jm signal 150j and select jm signal 155j are coupled to current control element 145j. Select jm signal 155j is coupled to the gate of NFET 215j. The drain terminal of NFET 215j is coupled to ground voltage 220, and the source terminal of NFET 215j is in turn coupled to the drain terminal of another NFET (not shown), thereby creating a pull-up NFET chain (215a through 215j) that terminates at the source terminal of NFET 215a. The source terminal of NFET 215a is coupled to the same input of NOR gate 210 that is coupled to the data output of each current control element 145a-i.

Turning now to FIG. 3, there is illustrated a high level logical flowchart of an exemplary method of implementing the configurable, low power high fan-in MUX of FIG. 1 (or FIG. 2), according to an embodiment of the invention. The process begins at block 300 in response to MUX 100 receiving one or more select signals along with one or more corresponding data signals. At block 305, each current control element that received a select signal determines whether the select signal is a high value (i.e., a logical "1"). If the select signal received by a particular current control element is a high value, the select signal activates the transmission gate within the current control element, thereby enabling the corresponding data signal to reach NAND gate 135, and the select signal also deactivates the PFET coupled to the current control element, thereby turning off the pull-up transistor path and preventing drain voltage 125 from providing a high default value (i.e., a logical "1") to the terminal of NAND gate 135 corresponding to the data signal, as depicted in block 310. The data signal that corresponds to the select signal thus drives (i.e., provides input to) NAND gate 135 at the terminal that is temporarily not receiving input from drain voltage 125, as shown in block 315, and the process terminates at block 330.

If the select signal received by a particular control element is not a high value (i.e., a logical "0"), the select signal deactivates the transmission gate within the control element, and the select signal activates the PFET coupled to the current control element, thereby turning on the pull-up transistor path and enabling drain voltage 125 to provide a high default value (i.e., a logical "1") to the corresponding terminal of NAND gate 135, as depicted in block 320. The activation of the pull up transistor path thus causes NAND gate 135 to function as an inverter, as shown in block 325, and the process terminates at block 330. When activated, a pull-up transistor path thus provides a high default value to an input terminal of NAND gate 135 and ensures that the temporarily de-activated (i.e., unselected) data paths of a particular fan-in element do not prevent data at other input terminals (i.e., data signals from other fan-in elements) from passing through NAND gate 135.

Figure 4:
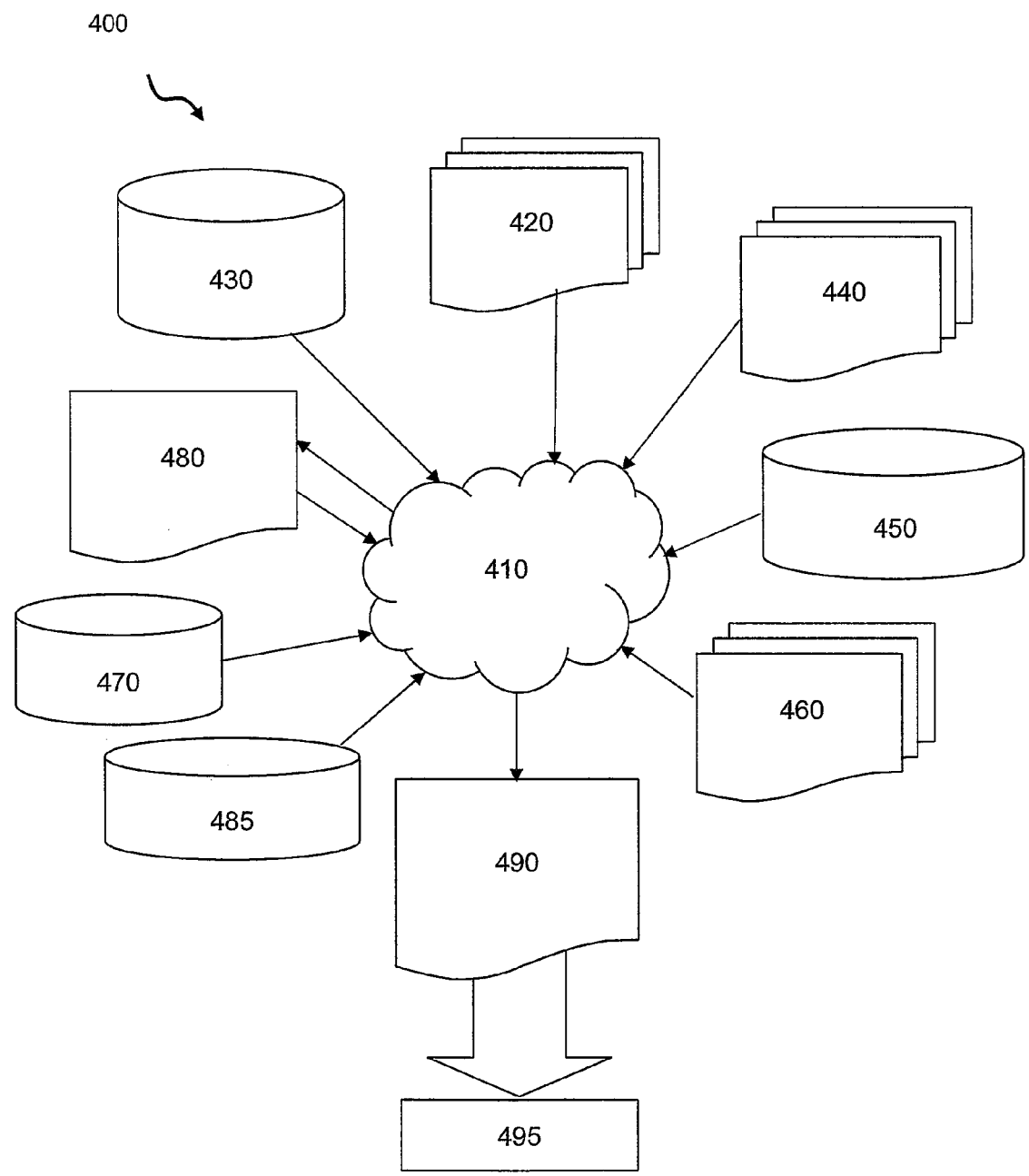
FIG. 4 is a flow diagram of a design process used in semiconductor design, manufacture, and/or test, according to one embodiment of the present invention.

FIG. 4 shows a block diagram of an exemplary design flow 400 used for example, in semiconductor IC logic design, simulation, test, layout, and manufacture. Design flow 400 includes processes and mechanisms for processing design structures to generate logically or otherwise functionally equivalent representations of the embodiments of the integrated circuit shown in FIGS. 1-2. The design structures processed and/or generated by design flow 400 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 4 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission or storage medium, design structure 420 may be accessed and processed by one or more hardware and/or software modules within design process 410 to simulate or otherwise functionally represent an electronic component, circuit, electronic or logic module, apparatus, device, or system such as those shown in FIGS. 1-2. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or logic structures shown in FIGS. 1-2 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include modules for performing standard circuit design processes such as timing analysis, verification, design rule checking, place and route operations, etc.

Design process 410 employs and incorporates well-known logic and physical design tools such as HDL compilers and simulation model build tools to process design structure 420 together with some or all of the depicted supporting data structures to generate a second design structure 490. Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2. In one embodiment, design structure 490 may comprise a compiled, executable HDL simulation model that functionally simulates the devices shown in FIGS. 1-2.

Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1-2. Design structure 490 may then proceed to a stage 495 where, for example, design structure 490: proceeds to tape-out, is released to manufacturing, is released to a mask house, is sent to another design house, is sent back to the customer, etc.

The present invention thus provides a design structure for a compact, low power, high fan-in MUX that may be arranged in multiple user friendly configurations. The MUX circuit includes multiple current control elements, which each include multiple inverters coupled to a transmission gate. Each current control element receives a data signal and a select signal that corresponds to the data signal. If a select signal exceeds a threshold value (e.g., a logical "1"), the select signal deactivates a pull-up transistor (e.g., a PFET), and the transmission gate enables the corresponding data signal to provide input to a logic gate (e.g., a NAND gate) coupled to the output of the MUX. If the select signal does not exceed the threshold value, the select signal activates the pull-up transistor, and the transmission gate prevents the corresponding data signal from providing input to the logic gate.

It is understood that the use herein of specific names are for example only and not meant to imply any limitations on the invention. The invention may thus be implemented with different nomenclature/terminology and associated functionality utilized to describe the above devices/utility, etc., without limitation.

In the flow chart (FIG. 3) above, while the process steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

While the invention has been particularly shown and described with reference to a preferred embodiment, it will be understood by those skilled in the art that various changes in form and detail may be made therein without departing from the spirit and scope of the invention.

What is claimed is:

1. A design structure embodied in a machine readable medium for designing, manufacturing, or testing a multiplexer (MUX) circuit, the design structure comprising:
   a logic gate;
   a plurality of pull-up transistors coupled in series between a reference voltage and an input of said logic gate;
   a plurality of current control elements with outputs coupled to said plurality of pull-up transistors and said input of said logic gate;
   a plurality of input signals coupled to respective inputs of said plurality of current control elements, wherein said plurality of input signals comprise a plurality of select signals and a plurality of corresponding data signals;
   wherein when a select signal exceeds a threshold value, the select signal deactivates a pull-up transistor and enables a data signal that corresponds to said select signal to provide input to said logic gate; and
   wherein when said select signal does not exceed said threshold value, the select signal activates said pull-up transistor and prevents said data signal from providing input to said logic gate.

2. The design structure of claim 1, wherein said plurality of current control elements further comprise a plurality of inverters coupled to a transmission gate that selectively enables said data signal to reach said logic gate when said select signal exceeds said threshold value.

3. The design structure of claim 1, wherein said threshold value corresponds to a logical "1".

4. The design structure of claim 1, wherein said logic gate is a NAND gate, said pull-up transistor is a p-type field effect transistor (PFET) with a source terminal coupled to said NAND gate and a gate terminal coupled to one of said plurality of current control elements, and said reference voltage is a drain voltage coupled to a drain terminal of said pull-up transistor.

5. The design structure of claim 1, wherein said logic gate is a NOR gate, said pull-up transistor is a n-type field effect transistor (NFET) with a source terminal coupled to said NAND gate and a gate terminal coupled to one of said plurality of current control elements, and said reference voltage is a ground voltage coupled to a drain terminal of said pull-up transistor.

6. The design structure of claim 1, wherein the design structure comprises a netlist.

7. The design structure of claim 1, wherein the design structure resides on storage medium as a data format used for the exchange of layout data of integrated circuits.

8. A method in a computer aided design system for generating a functional design model of a multiplexer (MUX) circuit that includes an output logic gate with inputs coupled to one or more current control elements and one or more corresponding pull up transistors, the method comprising:
   generating a functional computer-simulated representation of a mechanism for receiving a plurality of data signals and a plurality of select signals that correspond to said plurality of data signals;
   generating a functional computer-simulated representation of a mechanism for, when a select signal exceeds a threshold value, deactivating a pull-up transistor and enabling a data signal that corresponds to said select signal to provide input to said logic gate;
   generating a functional computer-simulated representation of a mechanism for, when said select signal does not exceed said threshold value, activating said pull-up transistor and preventing said data signal from providing input to said logic gate.

9. The method of claim 8, wherein said threshold value corresponds to a logical "1".

10. The method of claim 8, wherein said logic gate is a NAND gate and said pull-up transistor is a p-type field effect transistor (PFET) with a source terminal coupled to said NAND gate and a gate terminal coupled to one of said plurality of current control elements.

11. The method of claim 8, wherein said logic gate is a NOR gate and said pull-up transistor is a n-type field effect transistor (NFET) with a source terminal coupled to said NOR gate and a gate terminal coupled to one of said plurality of current control elements.

12. A hardware description language (HDL) design structure encoded on a machine-readable data storage medium, said HDL design structure comprising elements that when processed in a computer-aided design system generates a machine-executable representation of an integrated circuit, wherein the HDL design structure comprises:
   a first element processed to generate a functional computer-simulated representation of a mechanism for generating a functional computer-simulated representation of a mechanism for receiving a plurality of data signals and a plurality of select signals that correspond to said plurality of data signal, in a computer aided design system for generating a functional design model of a multiplexer (MUX) circuit that includes an output logic gate with inputs coupled to one or more current control elements and one or more corresponding pull up transistors;
   a second element processed to generate a functional computer-simulated representation of a mechanism for generating a functional computer-simulated representation of a mechanism for, when a select signal exceeds a threshold value, deactivating a pull-up transistor and enabling a data signal that corresponds to said select signal to provide input to said logic gate;
   a third element generating a functional computer-simulated representation of a mechanism for, when said select signal does not exceed said threshold value, activating said pull-up transistor and preventing said data signal from providing input to said logic gate.

13. The HDL design structure of claim 12, wherein said threshold value corresponds to a logical "1".

14. The HDL design structure of claim 12, wherein said logic gate is a NAND gate and said pull-up transistor is a p-type field effect transistor (PFET) with a source terminal coupled to said NAND gate and a gate terminal coupled to one of said plurality of current control elements.

15. The HDL design structure of claim 12, wherein said logic gate is a NOR gate and said pull-up transistor is a n-type field effect transistor (NFET) with a source terminal coupled to said NOR gate and a gate terminal coupled to one of said plurality of current control elements.

* * * * *